(12) United States Patent
Tseng et al.

(10) Patent No.: US 10,290,722 B2
(45) Date of Patent: May 14, 2019

(54) MEMORY DEVICE AND METHOD OF FABRICATING THEREOF

(71) Applicant: TAIWAN SEMICONDUCTOR MANUFACTURING CO., LTD., Hsinchu (TW)

(72) Inventors: Yu-Wen Tseng, Chiayi (TW); Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/338,490

(22) Filed: Oct. 31, 2016

(65) Prior Publication Data

US 2018/0122818 A1 May 3, 2018

(51) Int. Cl.
*H01L 29/51* (2006.01)
*H01L 27/11524* (2017.01)
*H01L 27/11534* (2017.01)
*H01L 29/66* (2006.01)

(52) U.S. Cl.
CPC .. *H01L 29/66545* (2013.01); *H01L 27/11524* (2013.01); *H01L 27/11534* (2013.01); *H01L 29/513* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 6,803,275 B1* | 10/2004 | Park | H01L 21/28282 257/E21.21 |
| 9,379,128 B1* | 6/2016 | Yi | H01L 27/11568 |
| 2008/0176371 A1* | 7/2008 | Rao | B82Y 10/00 438/257 |
| 2015/0060989 A1* | 3/2015 | Loiko | H01L 29/49 257/324 |
| 2015/0249140 A1* | 9/2015 | Shroff | H01L 29/66545 438/592 |
| 2015/0348786 A1* | 12/2015 | Loiko | H01L 21/28008 257/316 |

* cited by examiner

*Primary Examiner* — Charles D Garber
*Assistant Examiner* — Xiaoming Liu
(74) *Attorney, Agent, or Firm* — McClure, Qualey & Rodack, LLP

(57) ABSTRACT

A memory device includes a semiconductor substrate having a cell region and a peripheral region surrounding the cell region and a pair of control gate stacks on the cell region. Each of the control gate stacks includes a storage layer and a control gate on the storage layer. The memory device includes at least one high-κ metal gate stack disposed on the substrate. The high-κ metal gate stack has a metal gate and a high-κ dielectric film wrapping around the metal gate, and a top surface of the control gate is lower than a top surface of the metal gate.

20 Claims, 20 Drawing Sheets

MEMORY DEVICE AND METHOD OF FABRICATING THEREOF

BACKGROUND

Current trend in the semiconductor manufacturing is to integrate different components onto an ever more compact space. Such integration allows higher functional density while complicating manufacturing process due to circuit architecture. In some integrated circuit designs, polysilicon gate electrode is replaced with a metal gate electrode to improve device performance and achieve feature sizes.

Super-flash technology has enabled designers to create cost effective and high performance programmable system on chip (SOC) solutions through the use of split-gate flash memory cells. The aggressive scaling of the third generation embedded super-flash memory (ESF3) drives the flash memory capacity to a greater extent.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
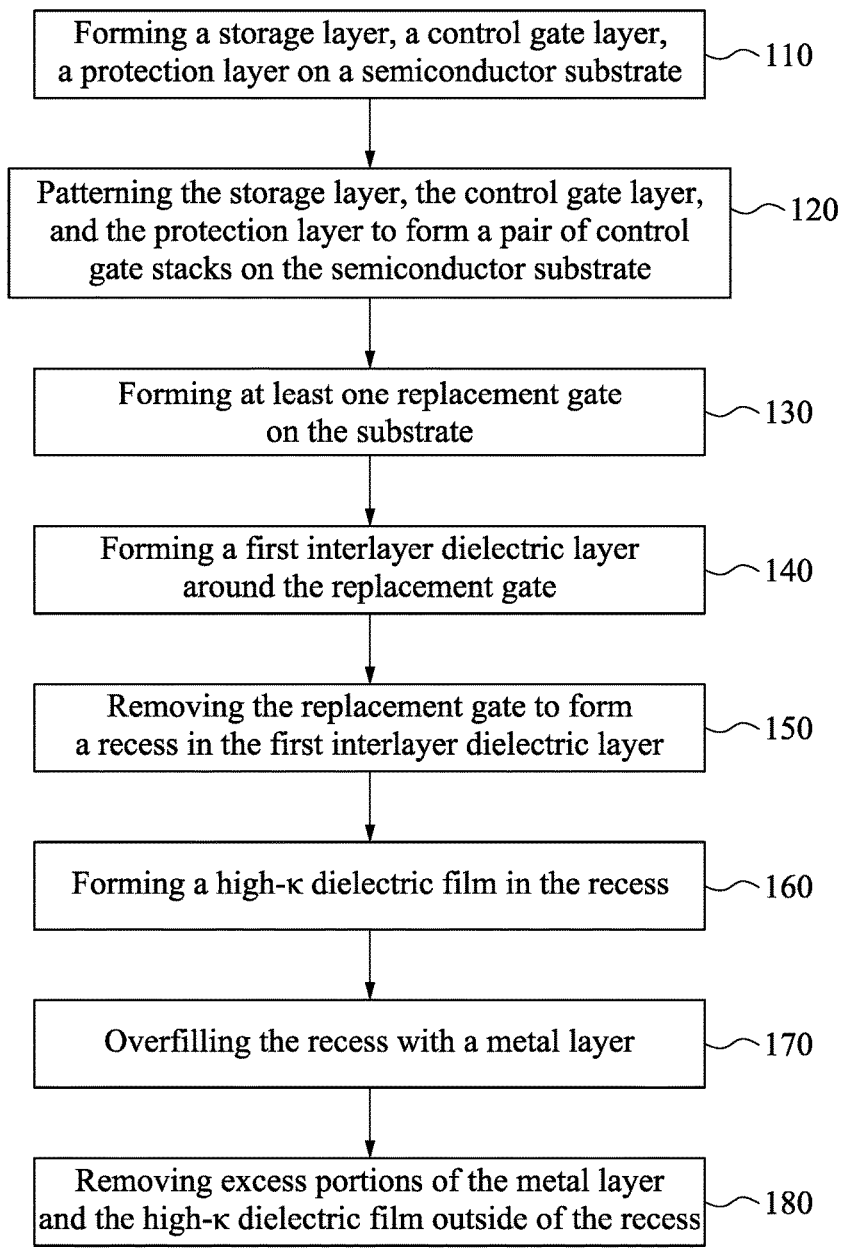
FIG. 1 is a block diagram illustrating an embodiment of a method of fabricating an integrated circuit having embedded flash memory cell in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 of fabricating a split gate in accordance with some exemplary embodiments of the instant disclosure. The method begins with operation 110 in which a storage layer, a control gate layer and a protection layer is formed on a semiconductor substrate. The method continues with operation 120 in which the storage layer, the control gate layer and the protection layer are patterned to form a pair of control gate stacks on the semiconductor substrate. The method continues with operation 130 in which at least one replacement gate is formed on the substrate. The method continues with operation 140 in which a first interlayer dielectric layer is formed around the replacement gate. The method continues with operation 150 in which the replacement gate is removed to form a recess in the first interlayer dielectric layer.

The method continues with operation 160 in which a high-κ dielectric film is formed in the recess. The method continues with operation 170 in which the excess portions of the metal layer and the high-κ dielectric film outside the recess are removed such that a top surface of the metal layer is substantially level with a top surface of the protection layer after the removing.

FIGS. 2 to 20 are cross-sectional views of a method of fabricating a split gate at various stages in accordance with some embodiments of the instant disclosure.

Figure 2:
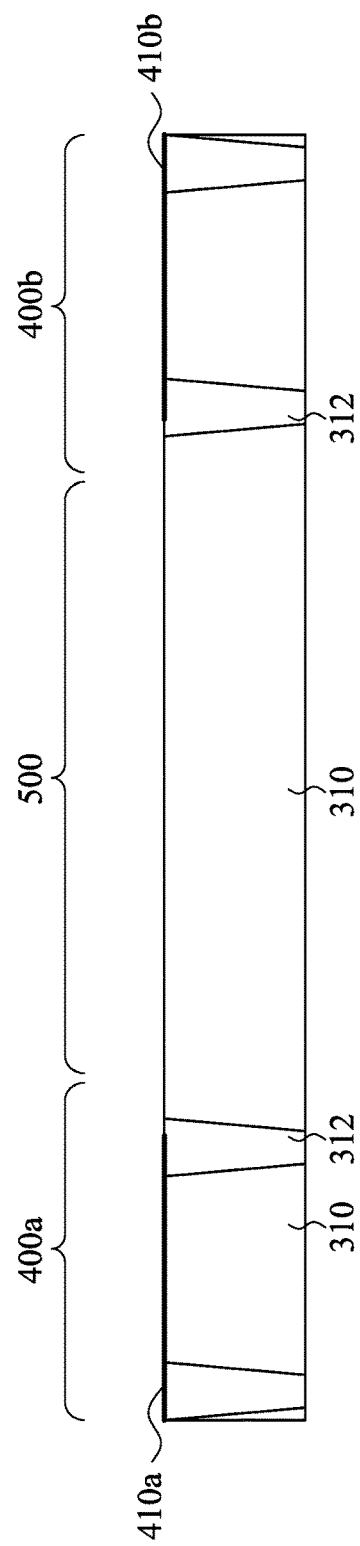
FIGS. 2-20 are schematic cross-sectional diagrams illustrating embodiments of the method shown in FIG. 1.

Turning now to FIG. 2, a semiconductor substrate 310 having a cell region 500 and peripheral regions 400a and 400b. The cell region 500 is spaced from the peripheral regions 400a and 400b by isolation features 312. The isolation features 312, for example, a shallow trench isolation, isolates memory cell devices on the cell region 500 from logic devices on the regions 400a and 400b.

In some embodiments, a logic cell is formed on the peripheral region 400a, and a high voltage cell is formed on the peripheral region 400b respectively. For the high voltage cell, n-well and p-well are formed in the semiconductor substrate 310. Subsequently, a sacrificial oxide layer is deposited on the semiconductor substrate 310. A photoresist is used, and the sacrificial oxide layer undergoes etching. The sacrificial oxide layer over the cell region 500 is removed, and sacrificial oxides 410a and 410b are formed on the peripheral regions 400a and 400b respectively. The cell region 500 is where a flash memory cell array is disposed and defined in between the peripheral regions 400a and 400b.

Figure 3:
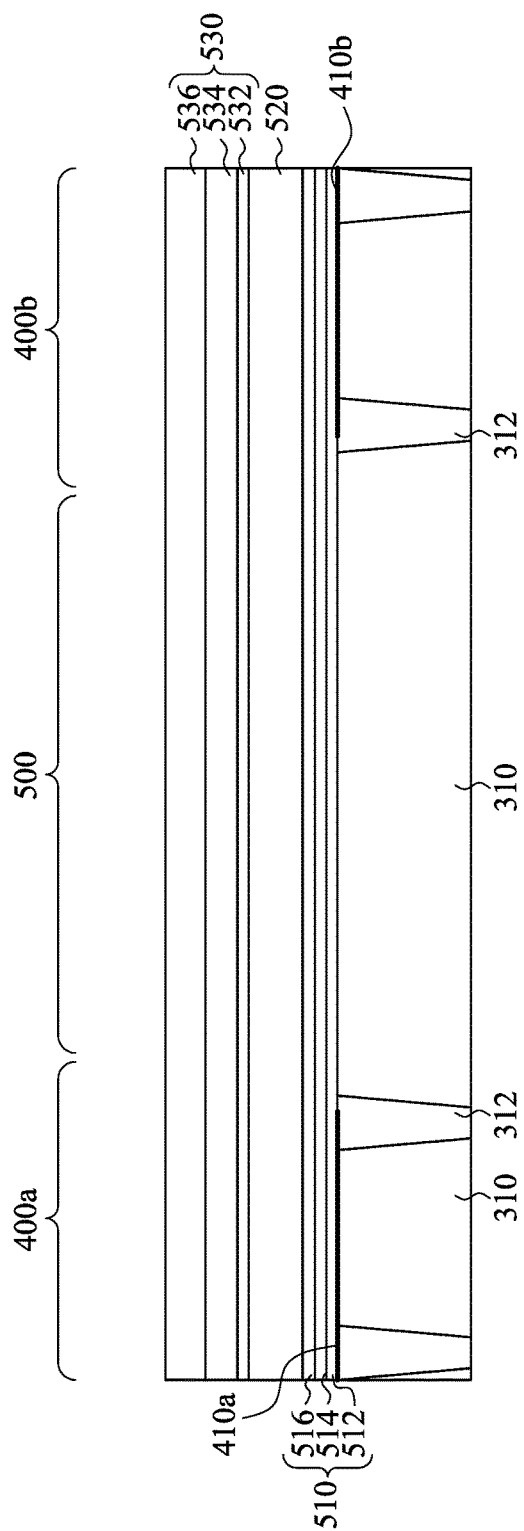

Turning now to FIG. 3, a storage layer 510, a control gate layer 520, and a protection layer 530 are deposited on the semiconductor substrate 310. The storage layer 510 conforms to the topology created by the sacrificial oxides 410a and 410b over the peripheral region 400a and 400b and blankets the entire surface of the semiconductor substrate 310. The storage layer 510 is in contact with the exposed surface of the semiconductor substrate 310 over the cell region 500. The storage layer 510 includes three layers, which are an oxide film 512, a nitride film 514, and another oxide film 516. The oxide film 512 is the bottom layer that covers the sacrificial oxides 410a and 410b and the exposed surface of the semiconductor substrate 310. The nitride film 514 is then deposited over the oxide film 512, followed by the other oxide film 516 on top of the nitride film 514. The nitride film 514 is interposed in between the two oxide films 512 and 516, and the three films collectively serve as the storage layer 510. The oxide films 512 and 516 and nitride film 514 are deposited by, for example chemical vapour deposition (CVD) or other suitable deposition methods. The entire thickness of the storage layer 510 ranges between about 80 and 90 angstroms. The thickness of the oxide film 512, 516, and nitride film 514 may be uniform or different. The nitride film 514 is configured to store charges in memory programming. The storage layer 510 replaces conventional floating gate, and the thinner profile of the storage layer 510 in comparison with a floating gate provides structural and processing advantages to the control gate stack. This will be elaborated hereinafter.

Still referring to FIG. 3, after the deposition of the storage layer 510, a control gate layer 520 is deposited on the storage layer 510. The control gate layer 520 blankets the entire exposed surface of the top oxide film 516. The control gate layer 520 is made of a material including, for example, doped polysilicon.

Subsequently, a protection layer (or a hard mask) 530 is deposited by, for example, CVD, over the control gate layer 520. In some embodiments, the protection layer 530 includes three layers, including a first nitride protection film 532, an oxide protection film 534, and a second nitride protection film 536. The first and second nitride protection films 532, 536 may be made of a material of silicon nitride. The thickness of the first and second nitride protection films 532, 536 and the oxide protection film 534 may be different or uniform. In some embodiments, the second nitride protection film 536 is the thickest among the three.

As shown in FIG. 3, multiple layers are stacked on the surface of the semiconductor substrate 310. On the cell region 500 are the storage layer 510, the control gate layer 520, and the protection layer 530. On the peripheral regions 400a and 400b, the layers from the bottom to the top are the sacrificial oxides 410a, 410b, the storage layer 510, the control gate layer 520, and the protection layer 530.

Figure 4:
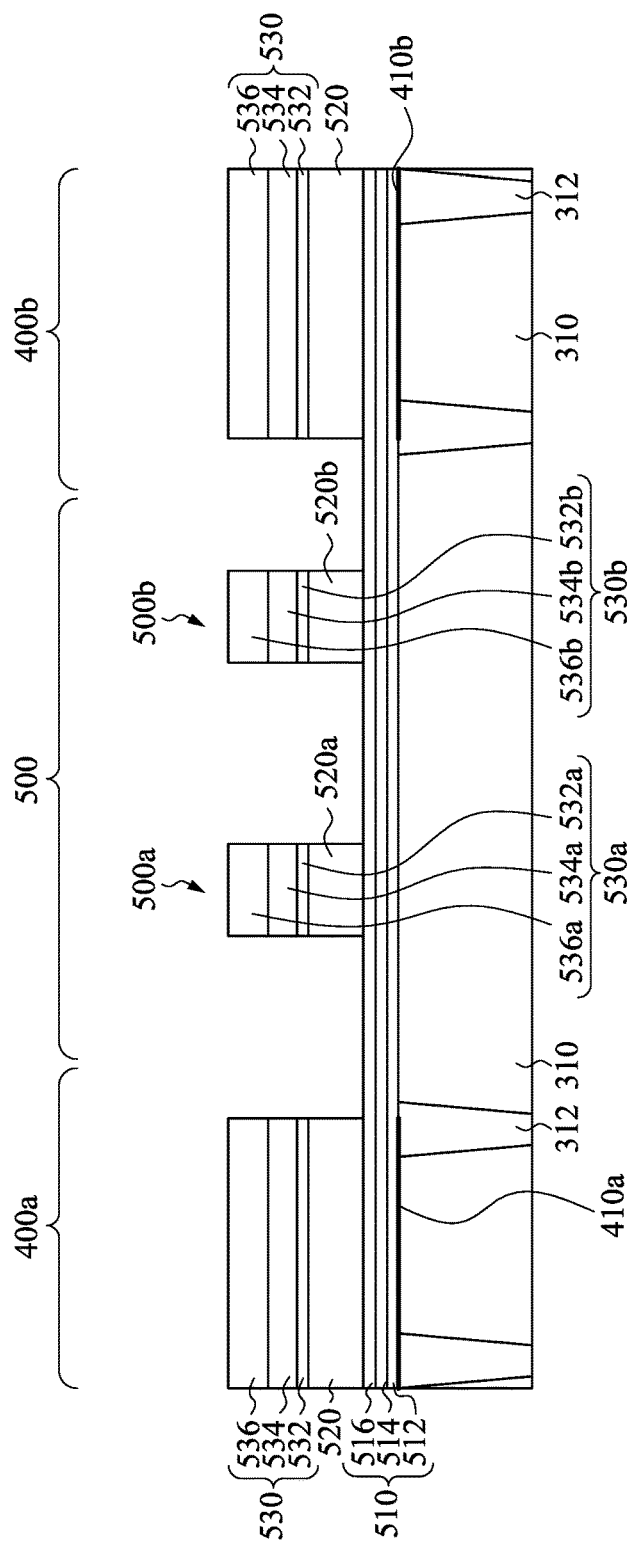

Reference is made to FIG. 4. Control gate stacks 500a, 500b are formed on the cell region 500. After the deposition of the storage layer 510, the control gate layer 520, and the protection layer 530, a photoresist is used, and an etching process is performed to define control gate stacks 500a, 500b over the cell region 500. The control gate stacks 500a, 500b are laterally spaced apart from each other, leaving a gap in between the control gate stacks 500a, 500b. The storage layer 510 is kept on the semiconductor substrate 310. The control gate stack 500a includes the storage layer 510, the control gate 520a, and the protection layer 530a that covers the control gate 520a. The control gate stack 500b has the same gate stack as the control gate stack 500a, including the storage layer 510, the control gate 520b, and the protection layer 530b.

Still referring to FIG. 4, on the peripheral regions 400a, 400b the sacrificial oxides 410a, 410b, storage layer 510, control gate layer 520, and protection layer 530 remain on the semiconductor substrate 310. The surface of the semiconductor substrate 310 is covered in portions. The control gate stacks 500a, 500b are spaced apart from the peripheral regions 400a, 400b.

Figure 5:
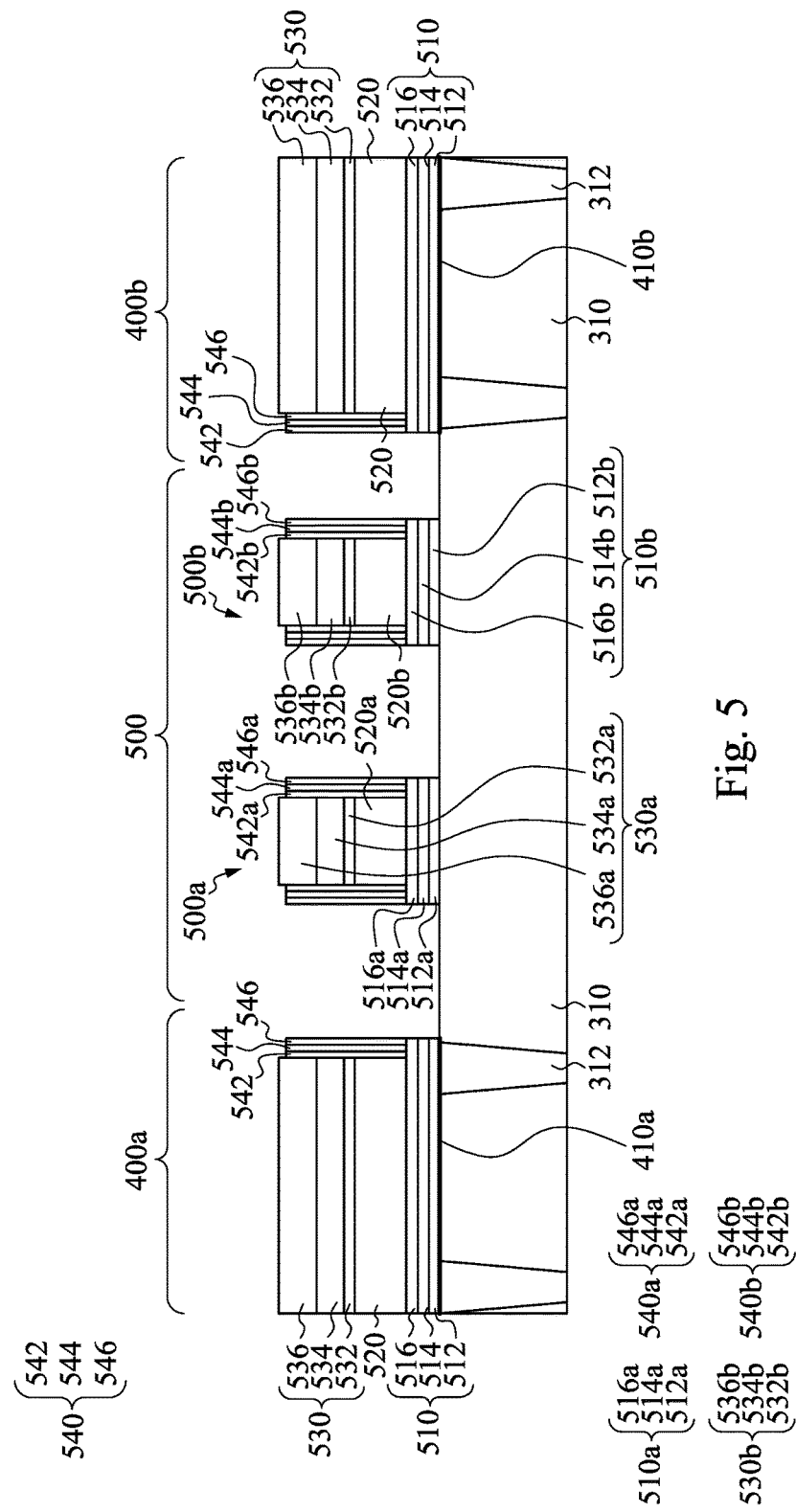

Referring to FIG. 5, control gate sidewalls are formed. The formation of the control gate sidewalls 540a, 540b includes blanket deposition of an oxide sidewall film 542, a nitride sidewall film 544, and another oxide sidewall film 546. A photoresist is used, and an etching is performed. After the etching, control gate sidewalls 540a and 540b are formed on two sides of the control gate stacks 500a, 500b. Take the control gate stack 500a for example. The control gate sidewall 540a includes the oxide sidewall films 542a that flanks the control gate 520a and the protection layer 530a, and the nitride sidewall films 544a are interposed in between the two oxide sidewall films 542a, 546a. Similarly, the control gate sidewall 540b has similar configuration as the control gate sidewall 540a. In addition, the storage layer 510 exposed on the surface of the semiconductor substrate is also removed during the etching, therefore exposing surface of the semiconductor substrate 310 in between the control gate stacks 500a, 500b and in between the cell region 500 and peripheral regions 400a, 400b. The oxide sidewall film 542, the nitride sidewall film 544 and the oxide sidewalls film 546 remain on the sidewalls of the control gate stacks on the peripheral regions 400a, 400b.

Figure 6:
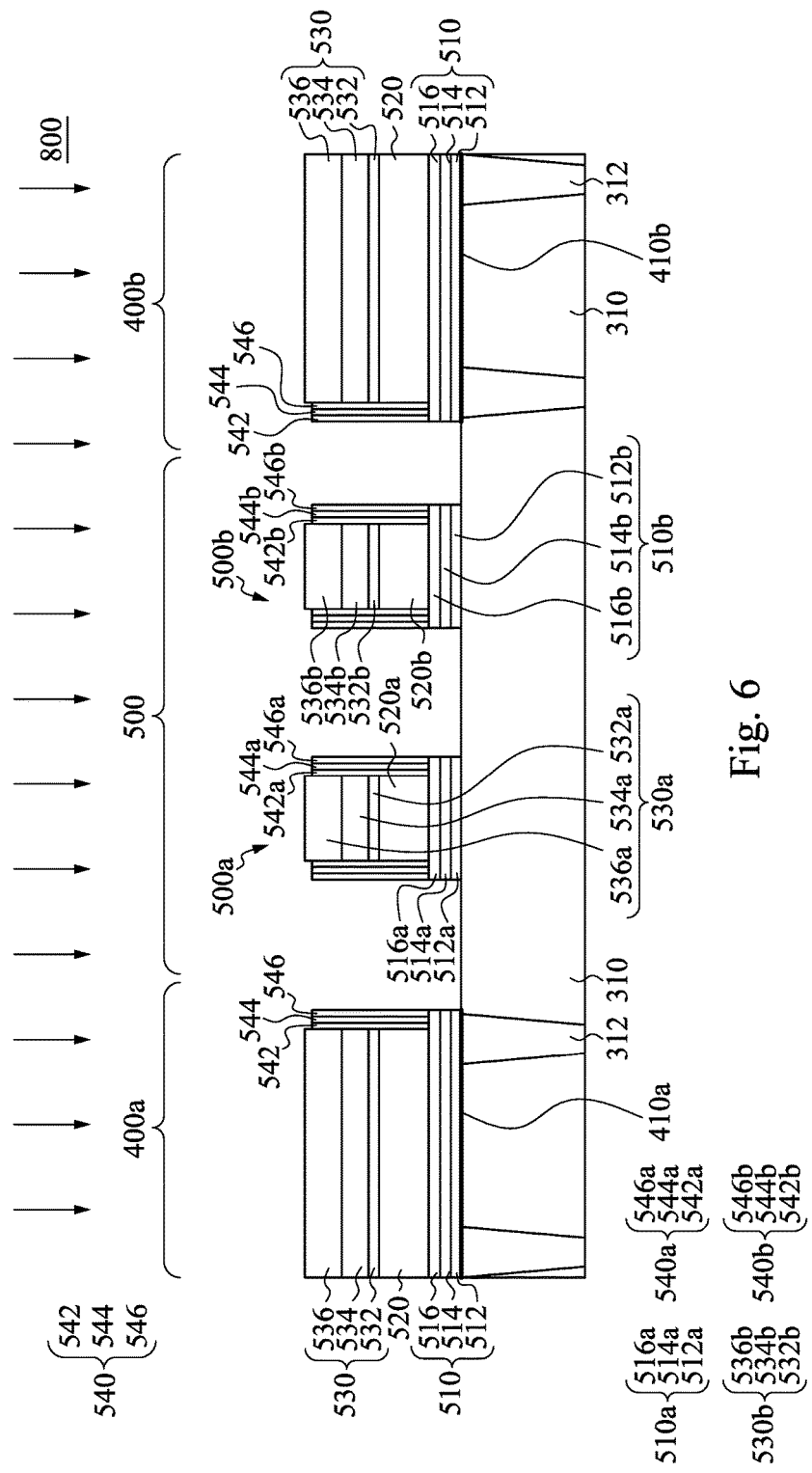

Referring to FIG. 6, an implantation 800 is performed. The implantation 800 allows word line dopant to be formed in the cell region 500. The peripheral regions 400a, 400b and control gate stacks 500a, 500b are covered by the protection layer 530 and therefore these places are protected from dopant implanting.

Figure 7:
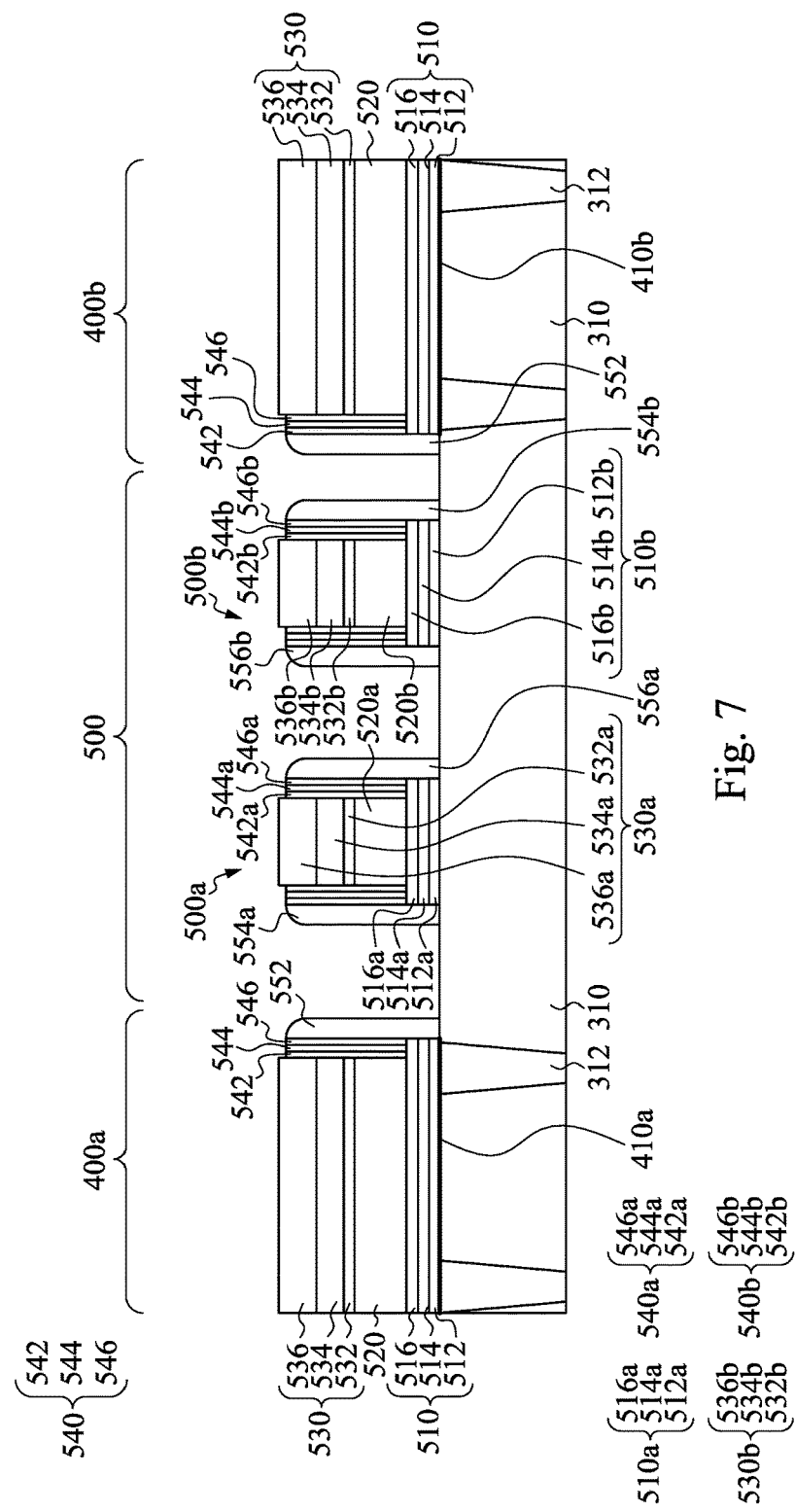

Referring to FIG. 7, following the word line implantation, a gap oxide layer is formed on two sides of the control gate stacks. A gap oxide layer is deposited on the semiconductor substrate 310, for example, by CVD. A photoresist is used, and the gap oxide layer is etched to form the gap oxide layers 554a, 556a, 554b, and 556b on the control gate sidewalls 540a, 540b. The gap oxide layers 554a, 554b are facing the peripheral region 400a, 400b respectively. The gap oxide layers 556a, 556b are facing each other in between the control gate stacks 500a, 500b. The gap oxide layers 552 are formed on the control gate sidewalls 540 on the peripheral regions 400a, 400b.

In some embodiments, a material of the gap oxide layer is a high temperature oxide. Before etching the high temperature oxide to form the gap oxide layers 552, 554a, 556a, 554b, and 556b, a rapid thermal annealing is performed to densify the high temperature oxide. After the annealing process, the high temperature oxide is more compact and ready to be etched.

Figure 8:
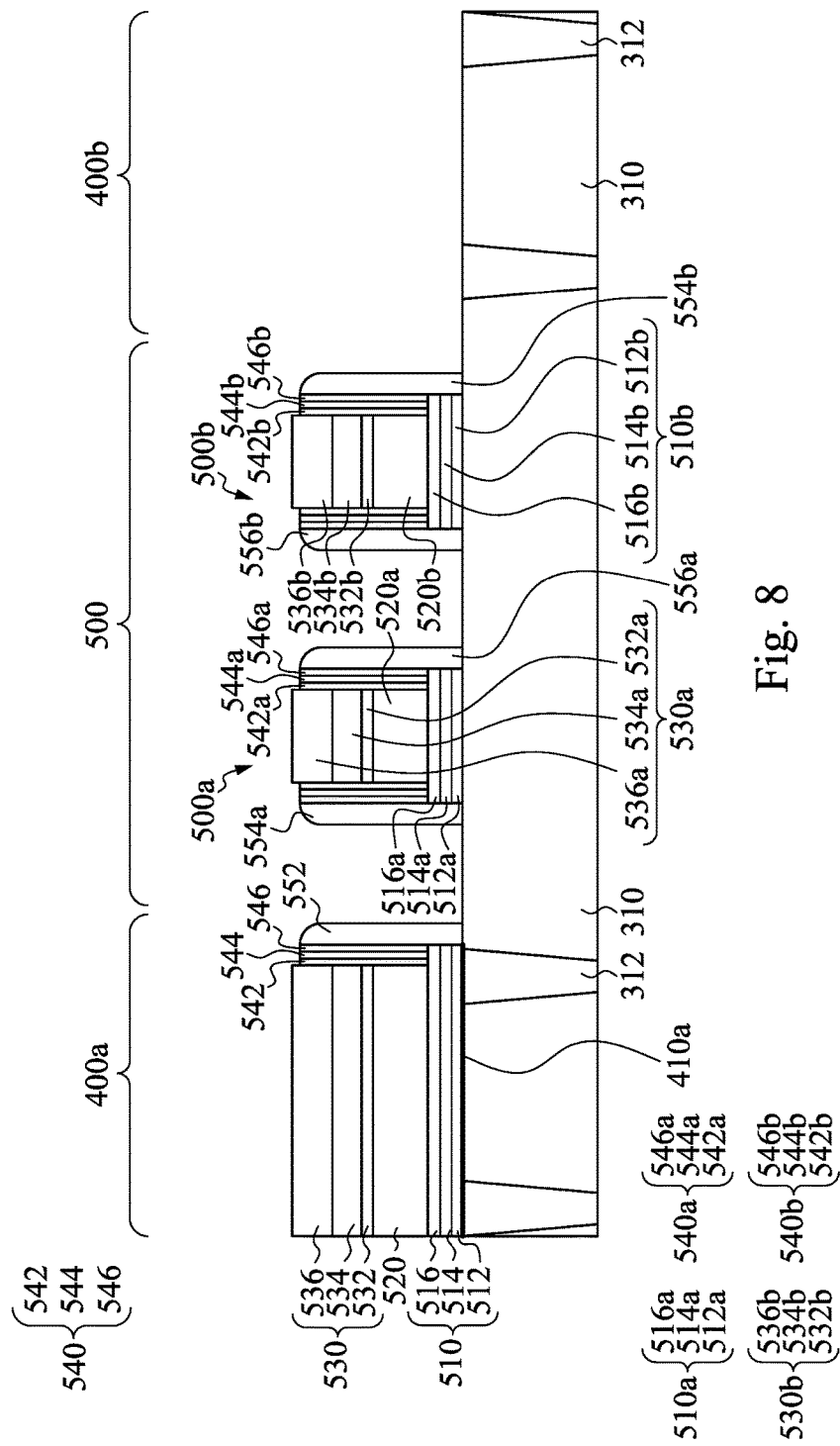

Referring to FIG. 8, the peripheral region 400b is exposed. More specifically, a photoresist is used to cover the peripheral region 400a and the cell region 500, and etching is performed to remove the layers overlying the peripheral region 400b. The top most protection layer 530 is removed, followed by the control gate layer 520 and the storage layer 510. The sacrificial oxide 410b over the peripheral region 400b is finally removed by wet etching. The overlying layers on the peripheral region 400a and the cell region 500 are retained, and the peripheral region 400b is exposed.

Figure 9:
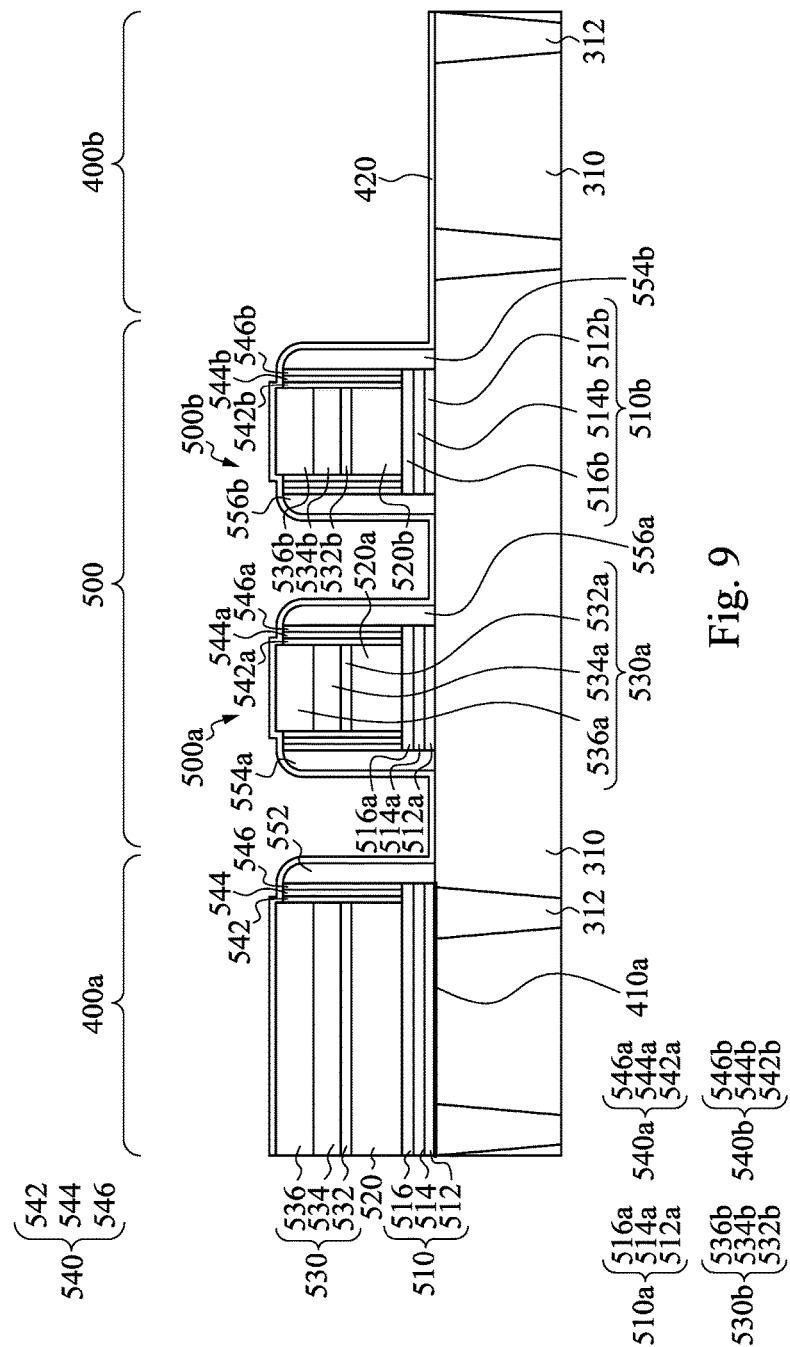

Referring to FIG. 9, a gate oxide layer 420 is formed over the semiconductor substrate 310. The gate oxide layer 420 is deposited on the semiconductor substrate 310 over the peripheral regions 400a, 400b, and the cell region 500 and blankets the entire surface of the structures on the semiconductor substrate 310. In some embodiments, the gate oxide layer 420 includes a material of high temperature oxide, which requires rapid thermal annealing to densify.

Figure 10:
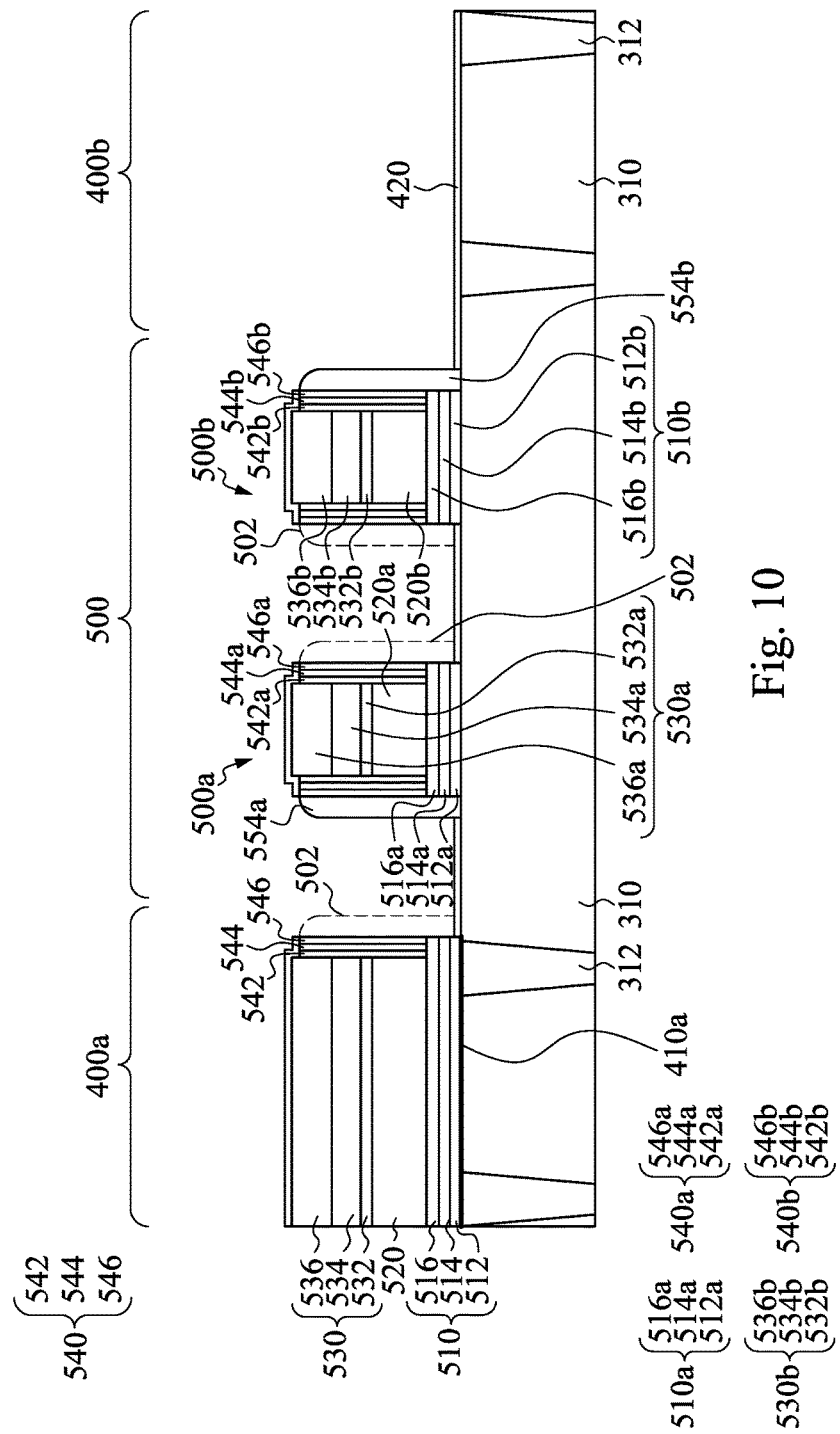

Referring to FIG. 10, a source side implantation is performed (not shown) after the formation of the gate oxide layer 420. A photoresist is used, and the gap oxide layers 552, 556a, 556b are exposed. After the source side implantation is performed, the gap oxide layer 552, 556a, 556b are converted into common source side oxide layers. Subsequently, the photoresist remains and is reused, and an etching is performed. The common source side oxide layers 552, 556a, and 556b are then removed. The boundary defined by the common source side oxide layers 552, 556a, and 556b are then treated as common source lines 502.

Figure 11:
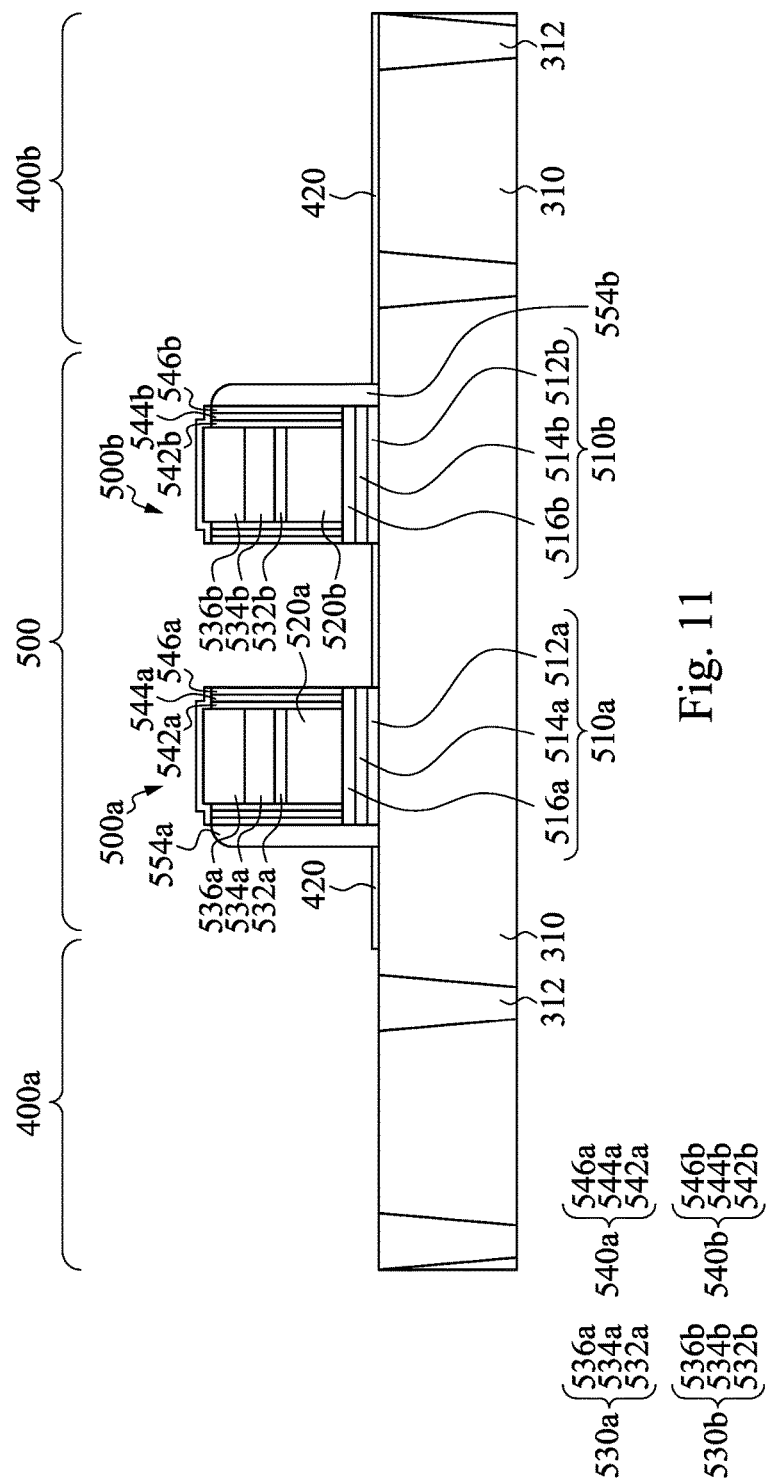

Referring to FIG. 11, the peripheral region 400a is exposed. In order to strip the layers overlying the peripheral region 400a, the top most gate oxide layer 420 is removed by wet etching. The removal of the protection layer 530 and the control gate layer 520 is achieved by dry etching. Then, the storage layer 510 and the control gate sidewall 540 are removed. The sacrificial oxide 410a is removed by wet etching, and the surface of the semiconductor substrate 310 on the peripheral region 400a is completely exposed. The cell region 500 and the peripheral region 400b are protected by a photoresist mask, and therefore the control gate stacks 500a, 500b and the gate oxide layer 420 over these regions are retained. The remaining gap oxide layer and the control gate sidewall are collectively named as a blocking layer. The blocking layer is disposed on one sidewall of the control gate.

Figure 12:
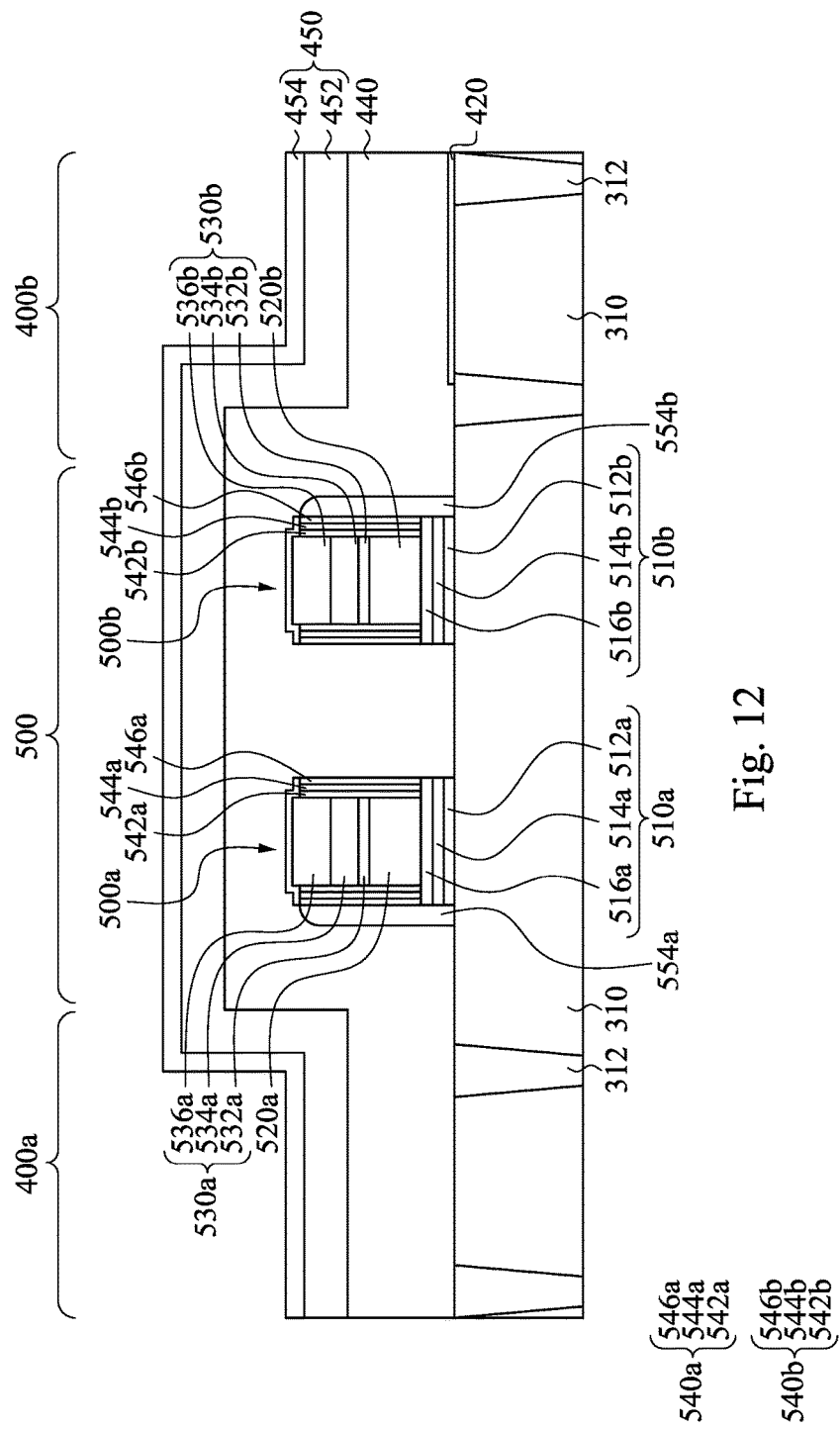

Referring to FIG. 12, a replacement gate layer 440 is deposited on the semiconductor substrate 310. Subsequently, the replacement gate layer 440 covers the control gate stacks 500a, 500b and the gate oxide layers 420. The replacement gate layer 440 fills the gap in between the control gate stacks 500a, 500b and exceeds the height of the control gate stacks 500a, 500b. The replacement gate layer 440 creates a step-like contour, where the cell region 500 is substantially planar and higher than the peripheral regions 400a, 400b.

Still referring to FIG. 12, in some embodiments, a polysilicon cap layer 450 is deposited on the replacement gate layer 440. The polysilicon cap layer 450 includes a nitride layer 452, for example, SiN, and a silicate layer 454, for example TEOS. At this stage, the scaffolding on the cell region 500 from the top to bottom is the silicate layer 454, the nitride layer 452, the replacement gate layer 440, and the gate oxide layer 420 over the control gate stacks 500a, 500b. On the peripheral region 400a, the semiconductor substrate 310 is covered by the replacement gate layer 440, and the polysilicon cap layer 450. On the peripheral region 400b, the gate oxide layer 420 remains on the surface of the semiconductor substrate 310, followed by the replacement gate layer 440, and the polysilicon cap layer 450.

Figure 13:
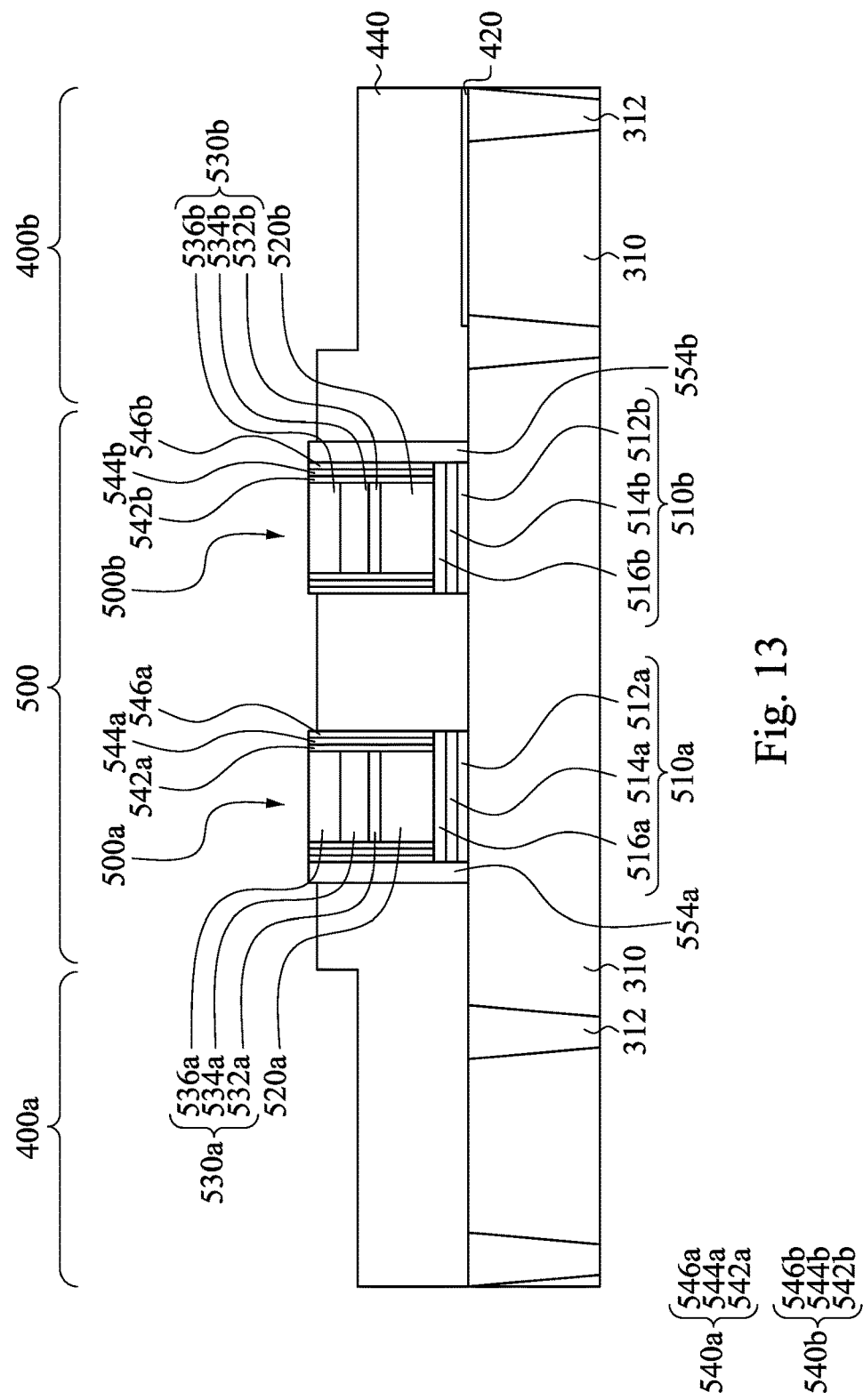

Referring to FIG. 13, a photoresist is used to protect the peripheral regions 400a, 400b, and an etching is performed to remove the polysilicon cap layer 450, and a portion of the replacement gate layer 440 on the cell region 500. After etching the cell region 500, the polysilicon cap layer 450 over the cell region 500 is completely removed, and the etching continues to remove the gate oxide layer 420 so as to expose the nitride protection films 536a, 536b of the protection layers 530a, 530b. Without the protection of the polysilicon cap layer 450, the replacement gate layer 440 on the cell region 500 is also slightly consumed, and therefore the control gate stacks 500a, 500b is marginally higher than the replacement gate layer 440. Next, the photoresist that protects the peripheral regions 400a, 400b is removed, and an etching back is performed to strip the polysilicon cap layer 450 on the peripheral regions 400a, 400b. A portion of the nitride protection films 536a, 536b is removed in the etching back process, resulting in a shorter control gate stack profile. A series of etching processes brings down the thickness of the control gate stacks 500a, 500b. The control gates 520a, 520b are well protected because of the protection layer 530.

Figure 14:
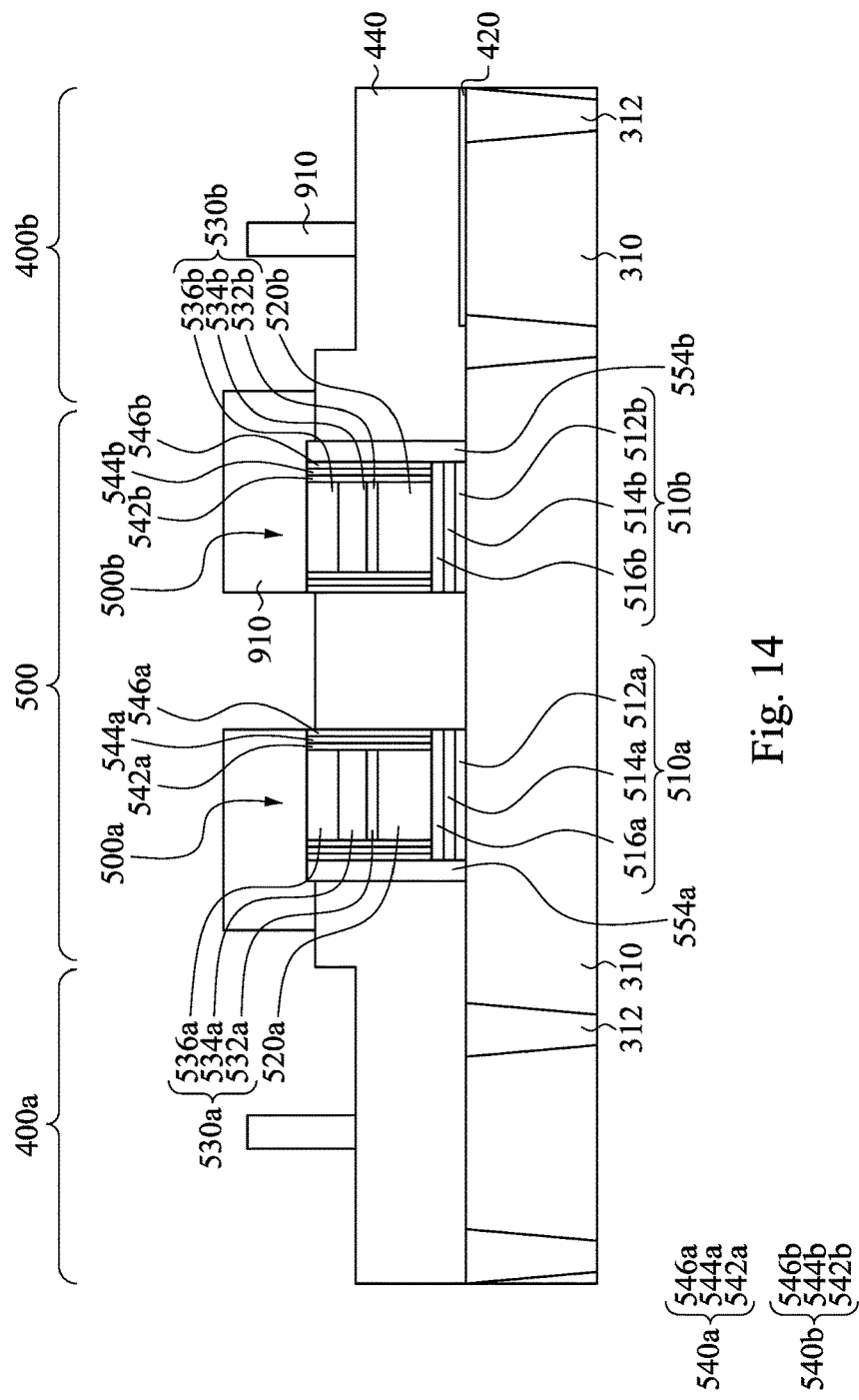

Referring to FIG. 14, a photoresist mask 910 is used to define replacement gates on the semiconductor substrate 310. The photoresist mask 910 is placed on the replacement gate layer 440 and the control gate stacks 500a, 500b. The photoresist mask 910 defines the positions where high-κ metal gates are to be formed. These high-κ metal gates include gate stacks over the peripheral regions 400a, 400b and the word lines over the cell region 500. In some embodiments, a positive photolithography is used, and when the substrate is exposed under radiation, for example, UV light, the bare areas are removed in the etching.

Figure 15:
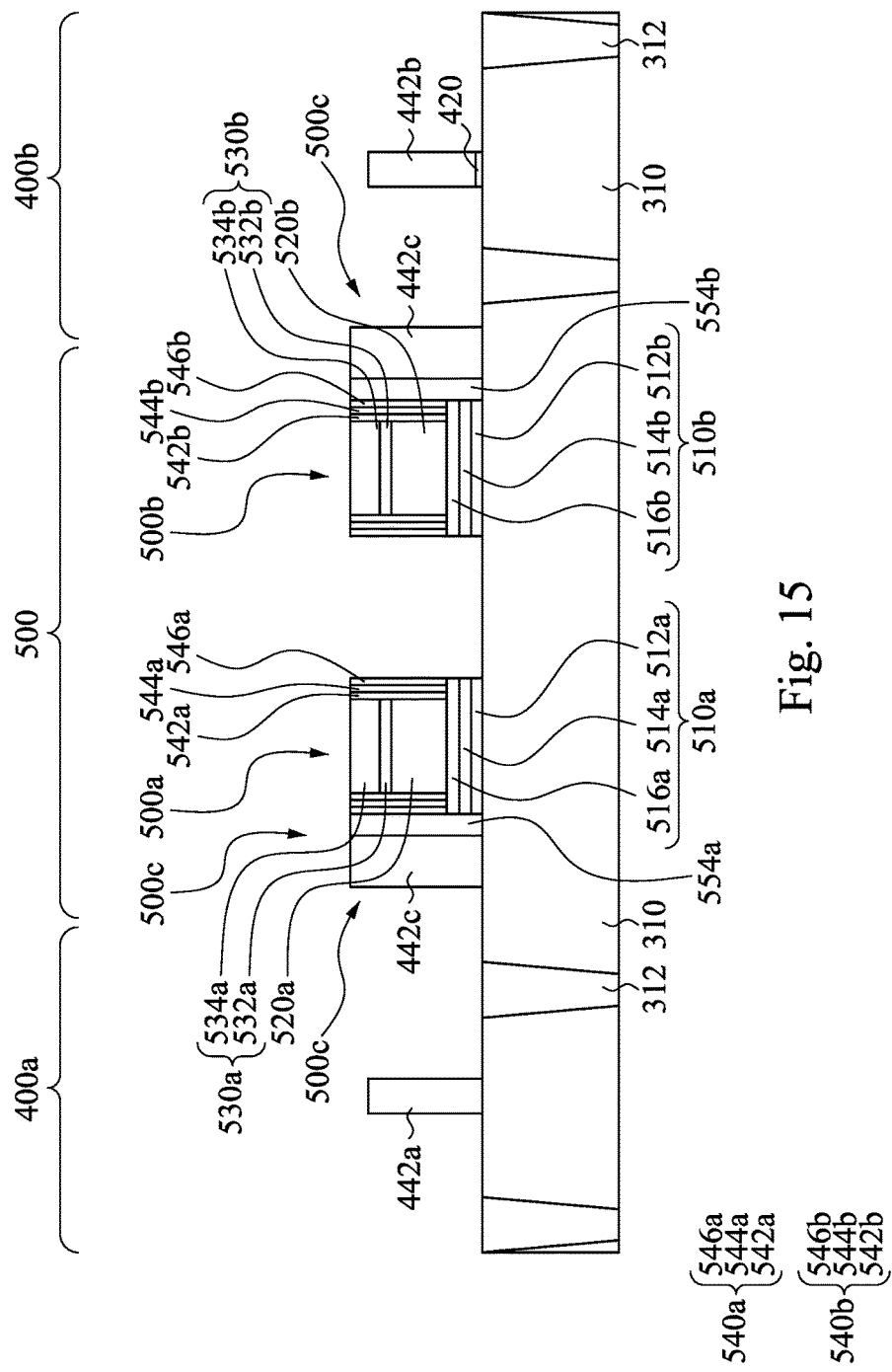

Referring to FIG. 15, replacement gates 442a, 442b, and 442c are formed on the semiconductor substrate 310. The replacement gates 442a and 442b are formed on the peripheral regions 400a and 400b respectively. The gate oxide layer 420 on the peripheral region 400b is remained. The replacement gates 442c adhere to the control gate sidewalls 554a and 554b and face the peripheral regions 400a, 400b. The replacement gates 442c are to be formed as word lines 500c in the split gate. The replacement gate layer in between the control gate stacks 500a, 500b are removed in the etching, leaving a gap behind. In order to bring the replacement gates 442c and control gate stacks 500a, 500b to a similar height with the replacement gates 442a, 442b on the peripheral regions 400a, 400b, another etching is performed to completely remove the remaining nitride protection films 556a, 556b. The oxide protection films 554a, 554b are then exposed after replacement gate definition. Subsequently, lightly-doped drain and source (LDD) regions (not shown) are formed in the semiconductor substrate 310.

Figure 16:
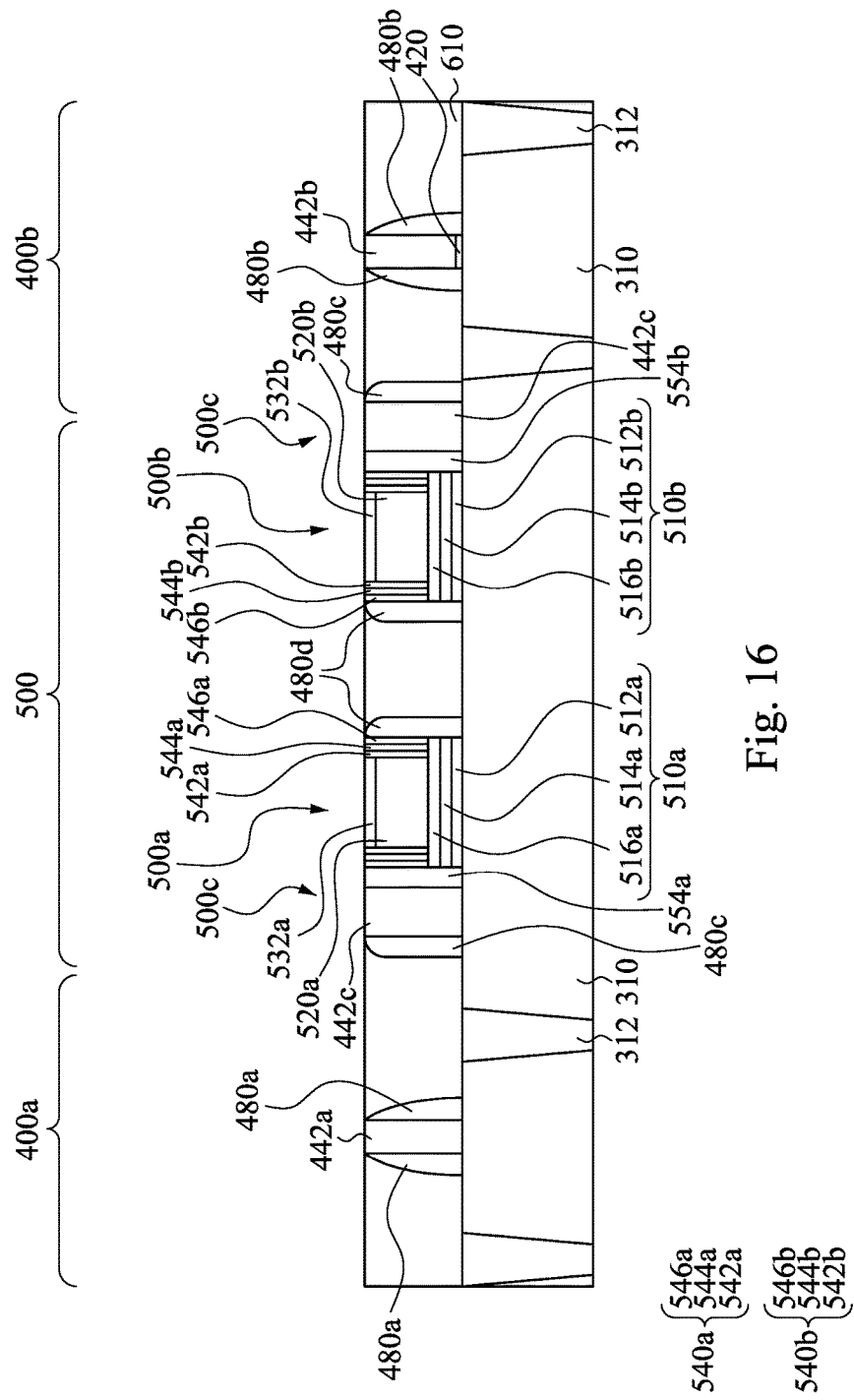

Referring to FIG. 16, sidewall spacers are formed. A sidewall spacer layer is deposited on the semiconductor substrate 310, covering the entire surface of the semiconductor substrate 310. Pairs of sidewall spacers 480a, 480b are formed on the peripheral region 400a, 400b. Each pair of the sidewall spacers 480a, 480b flanks the replacement gates 442a, 442b. Sidewall spacers 480c are formed to adhere to one side of the replacement gates 442c on the cell region 500. Take one of the word lines 500c for example. The sidewall spacer 480c covers one side of the replacement gate 442c, and the replacement gate 442c is enclosed by the sidewall spacer 480c and the gap oxide layer 554a on the cell region 500. The blocking layer (i.e., the gap oxide layer 554a and the control gate sidewalls 540a) is between the word line 500c and the control gate 520a. A pair of sidewall spacers 480d is formed along the control gate sidewalls 540a, 540b. The sidewalls spacers 480d face each other in the gap in between the control gate stacks 500a, 500b.

Still referring to FIG. 16, a first interlayer dielectric layer 610 is formed on the semiconductor substrate 310. By blanket deposition, the first interlayer dielectric layer 610 is deposited and covers the entire semiconductor substrate 310 including the replacement gates 442a, 442b, 442c and the control gate stacks 500a, 500b. The first interlayer dielectric layer 610 fills in the gap in between the pair of sidewall spacers 480d. Subsequently, the first interlayer dielectric layer 610 undergoes chemical mechanical polishing (CMP), and the CMP continues until the oxide protection films 534a, 534b of the control gate stacks 500a, 500b are removed. The thickness of the control gate stacks 500a, 500b continue to reduce, but the control gates 520a, 520b are well protected for many reasons. The storage layers 510a, 510b are much thinner in comparison with conventional floating gate, and therefore the control gates 520a, 520b are positioned at a lower level. In addition, the protection layers 530a, 530b protect the control gates 520a, 520b from the top during multiple etching processes. After the first interlayer dielectric layer 610 is polished, the replacement gates 442a, 442b, 442c, and the control gate stacks 500a, 500b have substantially the same height measured from the surface of the semiconductor substrate 310 to the surface of the first interlayer dielectric layer 610. The control gates 520a, 520b are hidden underneath the nitride protection films 532a, 532b.

Figure 17:
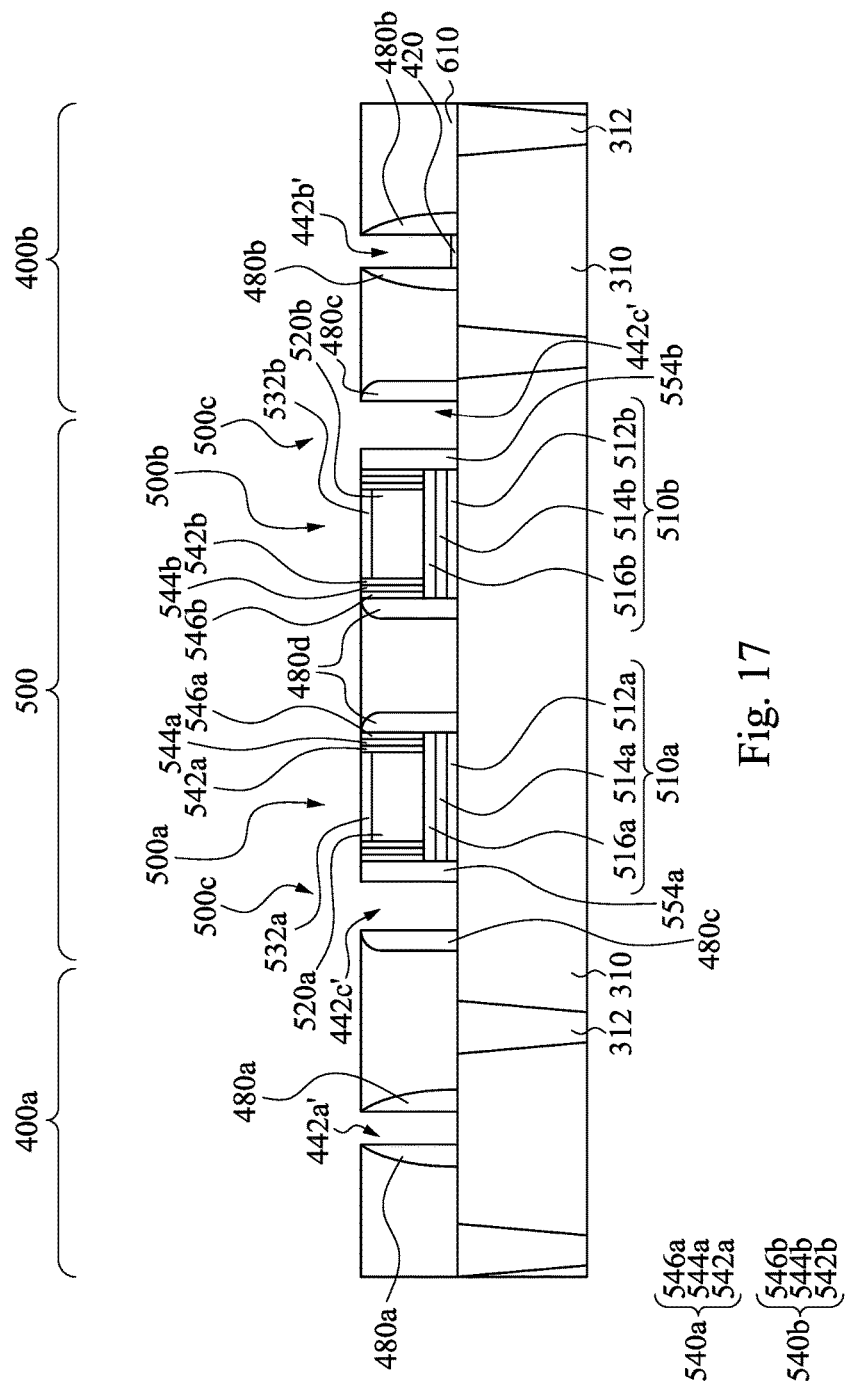

Referring to FIG. 17, the replacement gates 442a, 442b and 442c are removed. The removal of the replacement gates results in the formation of recess 442a', 442b', 442c'. Theses recess 442a', 442b', 442c' allows subsequent high-κ dielectric layer and metal gate filling.

Figure 18:
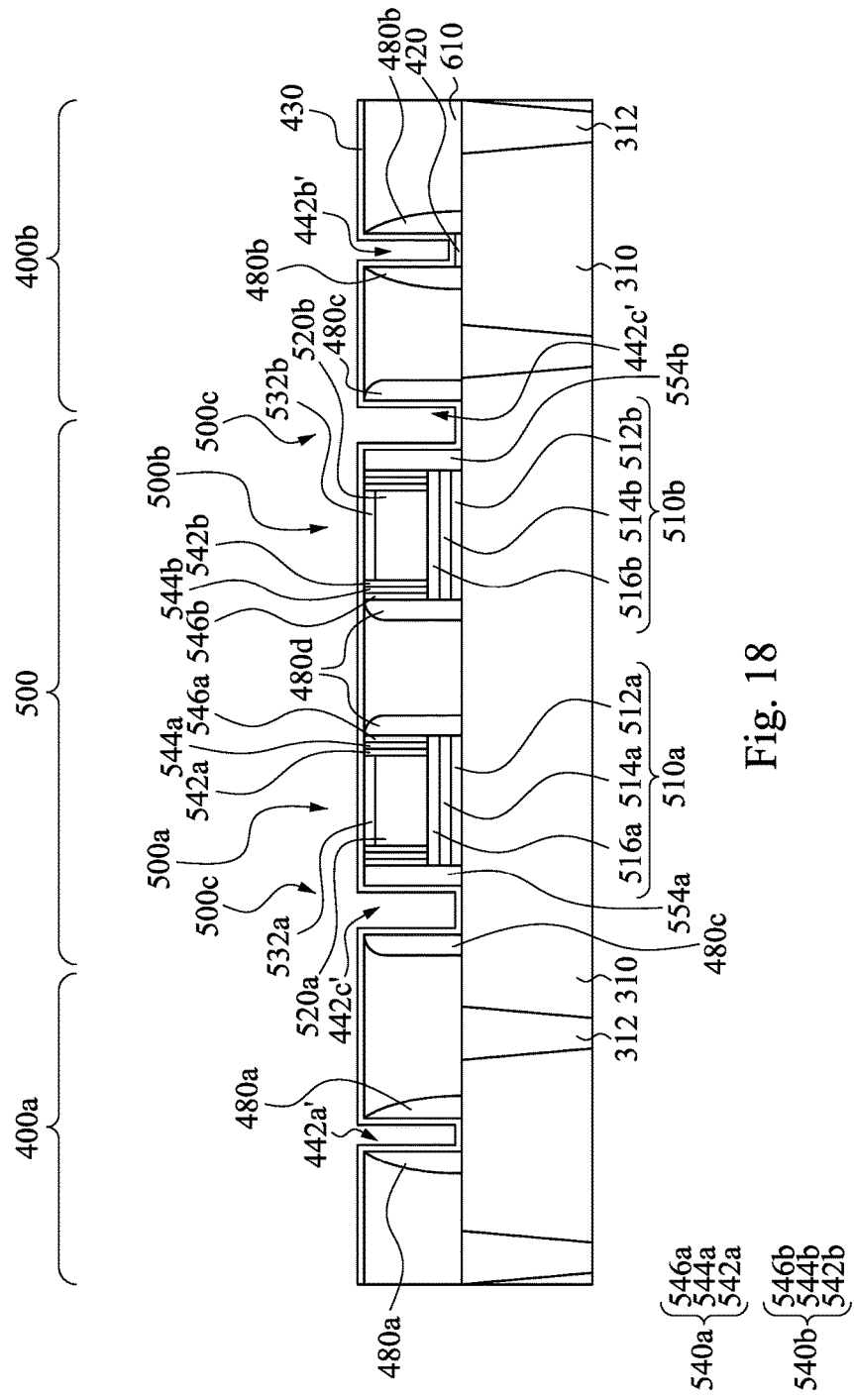

Referring to FIG. 18, a high-κ dielectric film 430 blankets the surface of the semiconductor substrate 310. A high-κ dielectric layer is deposited on the first interlayer dielectric layer 610 and fills in the recess 442a', 442b', 442c' where the replacement gates 442a, 442b, 442c used to occupy. A photoresist is used, and etching is performed to remove excess high-κ dielectric layer and leave a thin high-κ dielectric film 430 that follows the topology on the exposed surface of the semiconductor substrate 310. The high-κ dielectric film 430 covers the surface of the first interlayer dielectric layer 610 and the sidewalls of the recess 442a', 442b', 442c'. The high-κ dielectric film 430 is in contact with the surface of the semiconductor substrate 310 in the recess 442a' and 442b'. In the recess 442c', the high-κ dielectric film 430 is in contact with the gate oxide layer 420.

Figure 19:
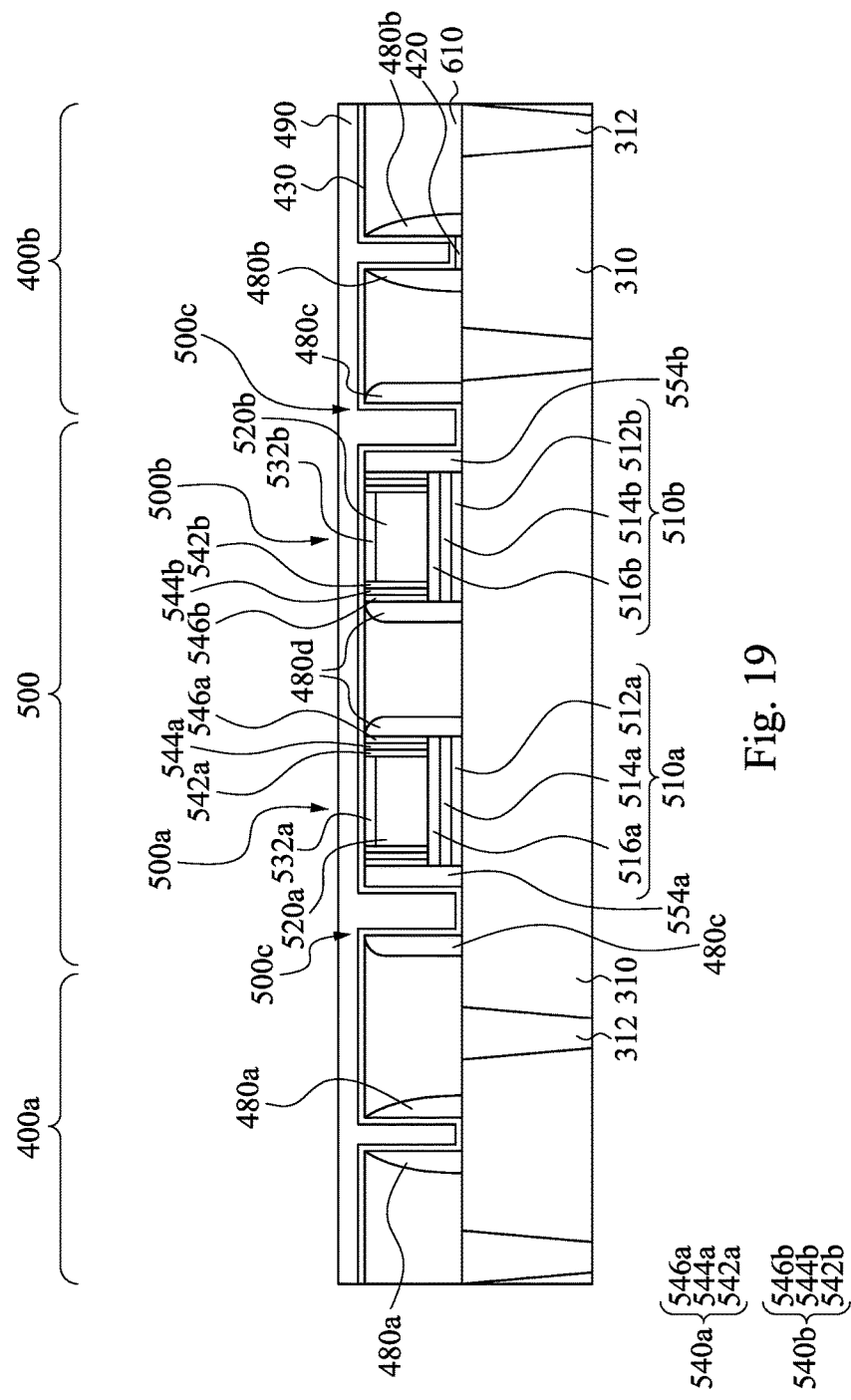

Referring to FIG. 19, a metal gate layer 490 is deposited on the semiconductor substrate 310. The metal gate layer 490 covers the high-κ dielectric film 430 and overfills the recess 442a', 442b', 442c'.

Figure 20:
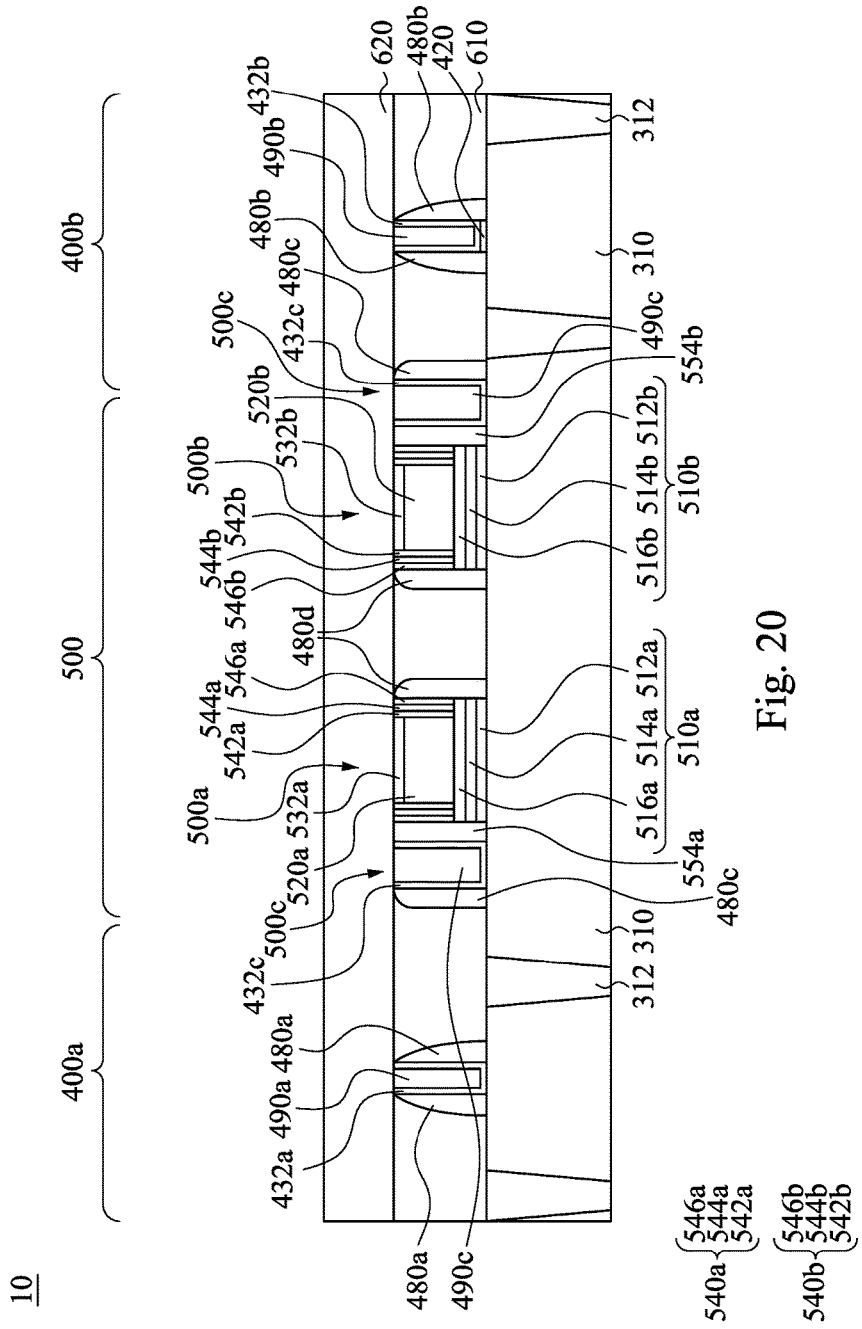

Referring to FIG. 20, formation of the metal gates 490a, 490b, 490c is shown. After the deposition of the metal gate layer 490, CMP is performed to bring down the overfilled metal gate layer 490 and the high-κ dielectric film 430 on the surface of the first interlayer dielectric layer 610. The metal gates 490a, 490b, 490c and edges of high-κ dielectric films 432a, 432b, 432c are substantial coplanar with the first interlayer dielectric layer 610. The metal gates 490a, 490b, 490c fill the recess 442a', 442b', 442c' respectively, and the high-κ dielectric film 430 becomes discrete after the metal gate layer 490 CMP. The high-κ dielectric film 432a, 432b, 432c resembles a shape of U that surrounds the metal gates 490a, 490b, 490c from three sides. Each pair of the metal gates and the high-κ dielectric films makes a high-κ metal gate. Take the high-κ metal gate on the peripheral region 400a for example. The high-κ dielectric film 432a wraps around the metal gate 490a from three sides, and the edges of the high-κ dielectric film 432a are at the same height with the surface of the metal gate 490a.

The control gates 520a, 520b are positioned at a level lower than the metal gates 490a, 490b, and 490c. The control gates 520a, 520b are protected by the nitride protection film 532a from the top and do not contact the second dielectric layer 620. That is, when measuring from the surface of the semiconductor substrate 310 to the first dielectric layer 610, the control gate stacks 500a, 500b have similar height with the high-κ metal gates 490a, 490b and 490c, and they are all contained in a single dielectric layer, but the control gates 520a, 520b are not coplanar with the metal gates 490a, 490b, and 490c. This arrangement allows the control gate stacks 500a, 500b to be placed on the same plane with the high-κ metal gates 490a, 490b, and 490c, while the control gates 520a, 520b are well protected and reserved throughout the non-volatile memory cell manufacturing process.

Still referring to FIG. 20, a second dielectric layer 620 is deposited on the first dielectric layer 610. When the second interlayer dielectric layer 620 is formed, the metal gate 490a, the high-κ dielectric film 432a, and the first interlayer dielectric layer 610 are all in contact with the second interlayer dielectric layer 620. Similarly, the word lines 500c on the cell region 500 and high-κ metal gate on the peripheral region 400b have the same characteristics.

Reference is made to FIG. 20. The non-volatile memory cell 10 includes a semiconductor substrate 310. The semiconductor substrate 310 is divided into a cell region 500 and peripheral regions 400a, 400b that surround the cell region 500. The cell region 500 includes split gates. A pair of control gate stacks 500a, 500b is disposed on the cell region 500 and spaced apart by interlayer dielectric layer. The other side of the control gate stacks 500a, 500b is occupied by word lines 500c. The architecture of the control gate stacks 500a, 500b and word lines 500c is elaborated hereinafter.

Take control gate stack 500a for example. The control gate stack 500a has a storage layer 510a. The storage layer 510a includes an oxide film 512a, a nitride film 514a and another oxide film 516a. The nitride film 514a is interposed in between the two oxide films 512a, 516a and configured to store charges. The storage layer 510a replaces conventional floating gate in a split gate structure and has a more compact profile. This compact profile contributes to a thinner control gate stack 500a in general. A thinner, or shorter, control gate stack 500a allows the split gate to be disposed on the same surface with other peripheral devices and have similar height as well. A control gate 520a is disposed on the storage layer 510a, and a nitride protection film 532a is disposed on the control gate 520a. The nitride protection film 532a is the residue of a protection layer 530a. The protection layer 530a is used as a hard mask for the control gate stack 500a. During fabrication process, a series of etching is performed, and the protection layer 530a is consumed to its bottom film, which is the nitride protection film 532a. Control gate sidewall 540a is formed on two sides of the control gate 520a. In some embodiments, the control gate sidewall 540a includes an oxide sidewall film 542a, a nitride sidewall film 544a, and another oxide sidewall film 546a. The nitride sidewall film 544a is interposed in between the two oxide sidewall films 542a, 546a. A gap oxide layer 554a is disposed in between the word line 500c and the control gate stack 500a.

The word line 500c is disposed on one side of the control gate stack 500a, and the blocking layer is interposed in between the word line 500c and the control gate stack 500a. The word line 500c is a high-κ metal gate having a metal portion. The metal gate 490c (or metal portion) of the word line 500c is wrapped by the high-κ dielectric film 432c. The high-κ dielectric film 432c encloses the metal gate 490c from three sides, and the edges of the high-κ dielectric film 432c and a top surface of the metal gate 490c are coplanar. The high-κ dielectric film 432c is in contact with the semiconductor substrate 310. Sidewall spacers 480c, 480d are disposed on one side of the word line 500c and the control gate stack 500a. The metal gate 490c is not in contact with the sidewall spacer 480c and the gap oxide layer 554a because the high-κ dielectric film 432c holds the metal gate 490c in a U-shape fashion.

The control gate 520a is positioned at a lower surface level than the metal gate 490c because the storage layer 510a is thinner, and the entire control gate stack 500a profile is shorter in comparison with conventional non-volatile memory cell structure. A top surface of the control gate 520a is lower than a top surface of the metal gate 490c. This shrinkage in the height of the control gate stack 500a allows the control gate stack 500a to be placed on the same surface as the word line 500c (high-κ metal gate), and the control gate 520a is well protected throughout the fabrication process due to its lower surface level. The split gate is contained in a single first dielectric layer 610, and the word line 500c (high-κ metal gate) and the control gate stack 500a have similar height measured from the surface of the semiconductor substrate 310 and to the surface of the first dielectric layer 610. These traits are shared between the control gate stacks 500a and 500b.

Still referring to FIG. 20, the other high-κ metal gates on the peripheral regions 400a, 400b have similar configuration as the word line 500c. The metal gates 490a, 490b are wrapped around by the high-κ dielectric films 432a, 432b in U-shape, and only the top surface of the metal gates 490a, 490b are not covered by the high-κ dielectric films 432a, 432b. Sidewall spacers 480a, 480b adhere to two sides of the high-κ dielectric films 432a, 432b.

In operation, the non-volatile memory cell 10 stores charge, such as electrons, in the storage layer 510. The amount of charge stored in the storage layer 510 represents a binary value and is varied through program, read, and erase operations. These operations are performed through selective biasing of the control gates 520a, 520b, and the word lines 500c.

During a program operation of the non-volatile memory cell 10, the word lines 500c are biased and the control gates 520a, 520b are biased with a high voltage relative to voltages surrounding the storage layers 510a, 510b. The high bias voltage promotes Fowler-Nordheim tunnelling of carriers from an underlying channel region between the first memory source/drain region and the second memory source/drain region towards the control gates 520a, 520b. As the carriers tunnel towards the control gates 520a, 520b, the carriers become trapped in the storage layers 510a, 510b.

During an erase operation of the non-volatile memory cell 10, the gate is biased with a high voltage relative to voltages surrounding the storage layers 510a, 510b. The high bias voltage promotes Fowler-Nordheim tunnelling of carriers from the storage layers 510a, 510b towards other portions of the semiconductor substrate. As the carriers tunnel outwardly from the gate, the carriers become dislodged or otherwise removed from the storage layers 510a, 510b.

The embedded non-volatile memory cell 10 further includes one or more logic devices on the peripheral regions 400a, 400b. The logic devices coordinate to implement logic supporting operation of the control gate pair 500a, 500b and are, for example, transistors. In some embodiments, the logic devices are arranged around the control gate pair 500a, 500b. Further, in some embodiments, at least some of the logic devices are connected in series. In some embodiments, the logic devices are high-κ metal gates.

A thinner storage layer is used in the control gate stack such that the control gate is positioned at a lower surface level than the metal gate and protected by thick protection layer during fabrication. The fabrication process requires less masking steps, and all the gate structure can be retained in a thickness of a single interlayer dielectric layer. The device has mush compact profile and more simplified fabrication process because of a thinner control gate stack and reduction of etching cycles.

In some embodiments, the instant disclosure provides a memory device includes a semiconductor substrate having a cell region and a peripheral region surrounding the cell region and a pair of control gate stacks on the cell region. Each of the control gate stacks incudes a storage layer and a control gate on the storage layer. The memory device includes at least one high-κ metal gate stack disposed on the substrate. The high-κ metal gate stack has a metal gate and a high-κ dielectric film wrapping around the metal gate, and a top surface of the control gate is lower than a top surface of the metal gate.

In some embodiments, the instant disclosure provides a memory device includes a semiconductor substrate having a cell region and a peripheral region surrounding the cell region and a pair of control gate stacks on the cell region. Each of the control gate stacks incudes a storage layer and a control gate on the storage layer. The storage layer includes two oxide layers and a nitride layer, and the nitride layer is interposed in between the two oxide layers. The memory device includes at least one high-κ metal gate stack disposed on the substrate. The high-κ metal gate stack has a metal gate and a high-κ dielectric film wrapping around the metal gate.

In some embodiments, the instant disclosure provides a method of fabricating a memory device. The method includes forming a storage layer, a control gate layer, a protection layer on a semiconductor substrate. The control gate layer and the protection layer are patterned to form a pair of control gate stacks on the semiconductor substrate. At least one replacement gate is formed on the substrate. A first interlayer dielectric layer is formed around the replacement gate. The replacement gate is removed to form a recess in the first interlayer dielectric layer. A high-κ dielectric film is formed in the recess. The excess portions of the metal layer and the high-κ dielectric film outside the recess are removed such that a top surface of the metal layer is substantially level with a top surface of the protection layer after the removing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device comprising:
   a semiconductor substrate having a cell region and a peripheral region surrounding the cell region;
   a pair of control gate stacks on the cell region, wherein each of the control gate stacks comprises a storage layer, a sidewall spacer in contact with a sidewall of the storage layer, a control gate on the storage layer and spaced from the sidewall spacer, and a gate sidewall between the control gate and the sidewall spacer and comprising a nitride film in contact with a top surface of the storage layer; and
   at least one high-κ metal gate stack disposed on the semiconductor substrate, wherein the high-κ metal gate stack has a metal gate and a high-κ dielectric film wrapping around the metal gate, and a top surface of the control gate is lower than a top surface of the metal gate.

2. The memory device of claim 1, wherein the storage layer comprises two oxide layers and a nitride layer, and the nitride layer is interposed in between the two oxide layers.

3. The memory device of claim 1, wherein each of the control gate stacks comprises:
   a protection layer disposed on the control gate, wherein a top surface of the protection layer is substantially level with a top surface of the metal gate.

4. The memory device of claim 3, wherein the protection layer is made of silicon nitride.

5. The memory device of claim 1, wherein each of the control gate stacks comprises at least one blocking layer on at least one sidewall of the control gate.

6. The memory device of claim 5, further comprising at least one word line disposed on a sidewall of the blocking layer, such that the blocking layer is between the word line and the control gate.

7. The memory device of claim 6, wherein the word line comprises a metal portion.

8. The memory device of claim 7, wherein the word line comprises a high-κ dielectric film wrapping around the metal portion.

9. The memory device of claim 8, wherein the high-κ dielectric film of the word line and the high-κ dielectric film of the high-κ metal gate stack are made of substantially the same material.

10. The memory device of claim 7, wherein the metal portion and the metal gate are made of substantially the same material.

11. The memory device of claim 7, wherein the top surface of the control gate is lower than a top surface of the metal portion.

12. A memory device comprising:
a semiconductor substrate having a cell region and a peripheral region surrounding the cell region;
a pair of control gate stacks on the cell region, wherein each of the control gate stacks comprises a storage layer, a control gate on the storage layer, and a gate sidewall on a sidewall of the control gate, and the storage layer comprises two oxide layers and a nitride layer, and the nitride layer is interposed in between the two oxide layers, the gate sidewall comprises a nitride film and an oxide film separated from the control gate by the nitride film, and the oxide film is in contact with a top surface of the storage layer; and
at least one high-κ metal gate stack disposed on the semiconductor substrate, wherein the high-κ metal gate stack has a metal gate and a high-κ dielectric film wrapping around the metal gate.

13. The memory device of claim 12, wherein the control gate stacks and the high-κ metal gate stack have substantially the same thickness.

14. The memory device of claim 12, wherein the pair of control gate stacks share a common source.

15. A memory device comprising:
a semiconductor substrate having a cell region and a peripheral region surrounding the cell region;
a pair of control gate stacks in the cell region, wherein each of the control gate stacks comprises:
a storage layer,
a control gate,
a sidewall spacer, and
a gate sidewall between the control gate and the sidewall spacer and including a pair of sidewall films that have different materials, wherein top surfaces of the sidewall films are substantially coplanar;
a first high-κ metal gate stack in the cell region and having a metal gate and a first high-κ dielectric film wrapping around the metal gate; and
a second high-κ metal gate stack in the peripheral region and having a second high-κ dielectric film and a gate oxide between the second high-κ dielectric film and the semiconductor substrate.

16. The memory device of claim 15, wherein the storage layer comprises two oxide layers and a nitride layer between the two oxide layers.

17. The memory device of claim 15, wherein the second high-κ metal gate stack further includes a metal gate wrapped around by the second high-κ dielectric film.

18. The memory device of claim 17, wherein each of the control gate stacks comprises:
a protection layer disposed on the control gate, wherein a top surface of the protection layer is substantially level with a top surface of the metal gate of the first high-κ metal gate stack and a top surface of the metal gate of the second high-κ metal gate stack.

19. The memory device of claim 18, wherein the protection layer is made of silicon nitride.

20. The memory device of claim 15, wherein the gate sidewall comprises two oxide films and a nitride film, and the nitride film is interposed in between the two oxide films.

* * * * *